United States Patent
Meltzer

(10) Patent No.: US 7,268,635 B2
(45) Date of Patent: Sep. 11, 2007

(54) CIRCUITS FOR VOLTAGE-CONTROLLED RING OSCILLATORS AND METHOD OF GENERATING A PERIODIC SIGNAL

(75) Inventor: David Meltzer, Wappinger Falls, NY (US)

(73) Assignee: Seiko Epson Corporation, Tokyo (JP)

( * ) Notice: Subject to any disclaimer, the term of this patent is extended or adjusted under 35 U.S.C. 154(b) by 98 days.

(21) Appl. No.: 11/119,311

(22) Filed: Apr. 29, 2005

(65) Prior Publication Data

US 2006/0244543 A1   Nov. 2, 2006

(51) Int. Cl.
   *H03B 5/24*   (2006.01)
(52) U.S. Cl. .................. 331/57; 331/45; 331/177 V
(58) Field of Classification Search .............. 331/1 A, 331/18, 25, 36 C, 45, 57, 177 V
See application file for complete search history.

(56) References Cited

U.S. PATENT DOCUMENTS

| | | | |
|---|---|---|---|
| 5,012,142 A * | 4/1991 | Sonntag ................... 327/281 |
| 5,191,301 A * | 3/1993 | Mullgrav, Jr. ............ 331/57 |
| 5,602,514 A | 2/1997 | Monk et al. |
| 6,075,419 A | 6/2000 | Sun et al. |
| 6,396,358 B1 * | 5/2002 | Poss et al. ................ 331/57 |
| 6,690,243 B1 | 2/2004 | Henrion |
| 6,744,325 B2 | 6/2004 | Krawczyk, Jr. et al. |
| 6,842,078 B2 * | 1/2005 | Manna et al. ............. 331/57 |
| 7,061,334 B1 * | 6/2006 | Baig et al. ................ 331/57 |
| 2002/0008590 A1 | 1/2002 | Van Der Tang et al. |
| 2002/0057135 A1 | 5/2002 | Sun et al. |

FOREIGN PATENT DOCUMENTS

WO   WO 01/29966   4/2001

OTHER PUBLICATIONS

"CMOS Ring Oscillator with Quadrature Outputs and 100 MHz to 3.5 GHz Tuning Range", M. Grozing, et al., Institute of Electrical and Optical Communication Engineering, 2003, pp. 679-682.

* cited by examiner

*Primary Examiner*—David Mis

(57) ABSTRACT

Circuits and methods and for generating oscillator outputs using standard integrated circuit components. The basic circuit generally includes two inverters and a variable capacitor to configure a delay of the circuit input and/or output. The oscillator circuit generally includes a plurality of inverter circuits, at least one of which uses a variable capacitor to adjust a delay between stages, and thereby adjust a frequency of oscillation. Thus, the oscillator outputs may be tuned using a single control voltage. The method generally includes the steps of (1) applying an operating voltage to a ring oscillator comprising a plurality of stages; and (2) applying a control voltage to a variable capacitor coupled to a node between at least two of those stages. The circuits have particular advantage in quadrature oscillators, and may be easily implemented using widely available CMOS technology.

8 Claims, 4 Drawing Sheets

(Background)

(Background)

CIRCUITS FOR VOLTAGE-CONTROLLED RING OSCILLATORS AND METHOD OF GENERATING A PERIODIC SIGNAL

FIELD OF THE INVENTION

The present invention relates to clock sources and more particularly to high frequency ring oscillators, particularly for digital logic and communication applications.

DISCUSSION OF THE BACKGROUND

Processing of data for digital logic or communications applications generally requires a clock source at the frequency of the data. Ring oscillators have been widely used as high frequency clock sources, especially in phase-locked loop (PLL) applications where they may be used to multiply the frequency of a stable low frequency clock source. Ring oscillators are used due to their ease of design and very low silicon area when integrated on a chip. Conventional ring oscillators use an odd number of inversions to achieve stable oscillation. This suggests either an odd number of stages in the oscillator or use of a fully differential circuit design for each stage. Use of a fully differential circuit for each stage increases circuit area and is undesirable in some applications.

Clock sources often must be able to produce quadrature outputs, not just true and complement outputs. Two outputs are in quadrature when one is phase shifted by about one quarter of a period with relation to the other. When a ring oscillator has an odd number of stages, it is difficult to produce two outputs in quadrature (without additional circuitry). Therefore it is desirable to have an even number of stages in the ring oscillator, which is not generally possible with conventional designs other than differential circuit designs.

Array oscillator techniques have been applied to solve this problem. A recent example was published at the European Solid-State Circuits Conference 2003 (ESSCIRC 2003) entitled "CMOS Ring Oscillator with Quadrature Outputs and 100 MHz to 3.5 GHz Tuning Range" by M. Grozing et al. Their scheme is shown in FIG. 1, using eight identical CMOS inverter stages connected in a feed-forward array. The feed-forward inverters allow the normal four stage ring to oscillate and speed up the frequency. Since it is a ring with four identical output nodes, successive nodes are generally in quadrature.

This scheme as shown in FIG. 1 does not show any means for varying the frequency of oscillation, which is highly desired, if not required, for many PLL applications. Grozing et al. used the circuit shown in FIG. 2 for each inverter pair. The circuit of FIG. 2 represents, for example, inverters 102 and 106 in FIG. 1. P-channel bias transistor 203 and n-channel bias transistor 204 control (or "steer") the current available to turn a successive stage on and off, thus controlling the circuit delay and thus the frequency of the oscillator.

The current steering technique has two undesirable attributes. First, as the current changes, the up and down levels of the signals change. An output circuit which can respond to this varying level may need to be included in the oscillator. As the signal level gets lower, the noise also increases. The second undesirable attribute is that the frequency control voltage applied to the p-channel bias transistor 203 is generally different from the frequency control voltage applied to the n-channel bias transistor 204, but is generally related by a constant which is affected by manufacturing variations in transistor parameters. Grozing et al. teach the use of voltage regulator circuits to adjust the two control voltages.

From the above discussion it is apparent that simple circuits using standard CMOS inverter stages in an array oscillator configuration is desirable. It is also desirable to be able to control the frequency of the array oscillator using a single control voltage.

SUMMARY OF THE INVENTION

Embodiments of the present invention relate to circuits and methods for generating oscillator outputs using standard integrated circuit components. The basic circuit generally includes two inverters and a variable capacitor to configure a delay of the circuit input and/or output. The oscillator circuit generally includes a plurality of inverter circuits, at least one of which uses a variable capacitor to adjust a delay between stages, and thereby adjust a frequency of oscillation. Thus, the oscillator outputs may be tuned using a single control voltage. The method generally includes the steps of (1) applying an operating voltage to a ring oscillator comprising a plurality of stages; and (2) applying a control voltage to a variable capacitor coupled to a node between at least two of those stages. The circuits have particular advantage in quadrature oscillators, and may be easily implemented using widely available CMOS technology.

The present invention advantageously provides oscillation outputs whose frequency may be tuned with a single control voltage. These and other advantages of the present invention will become readily apparent from the detailed description of preferred embodiments below.

DETAILED DESCRIPTION OF THE PREFERRED EMBODIMENTS

Figure 1:
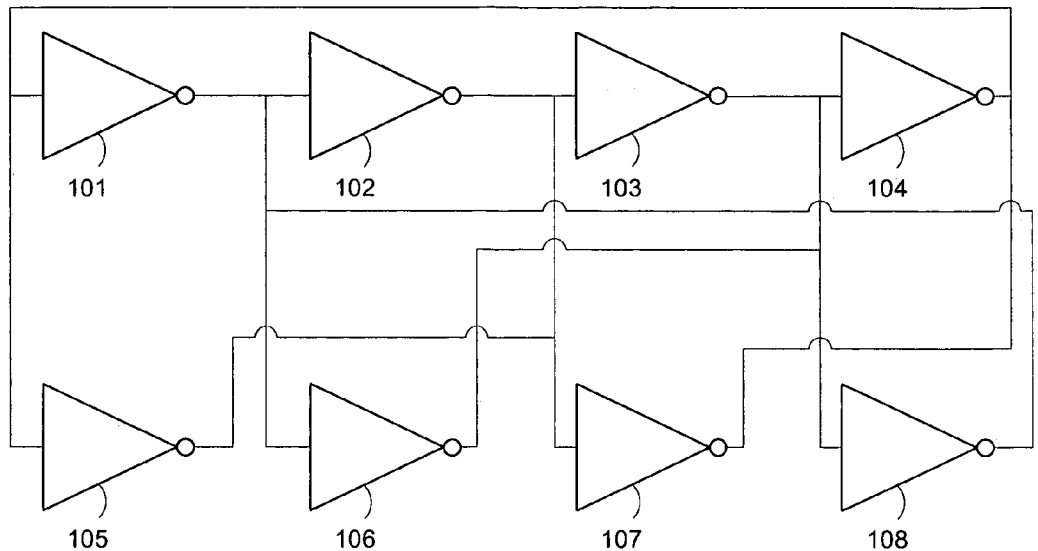
FIG. 1 is a diagram showing an array oscillator using eight identical CMOS inverter stages connected in a feed-forward array.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims.

Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "connected to," "coupled with," "coupled to," and "in communication with," may refer to direct or indirect relationships between two or more elements so connected or coupled, but these terms are also generally given their art-recognized meanings.

The present invention concerns circuits and methods for generating oscillator outputs. The circuit generally comprises first and second inverters. The first inverter is generally configured to receive a first input and to provide a first output. The second inverter is generally configured to receive the same input as the first inverter, and to provide a second output. A variable capacitor is generally coupled to the input and/or to one of the outputs. The circuit may be part of an oscillator comprising a plurality of stages, at least one of which comprises the above dual-inverter circuit, configured to (i) receive an output of at least one preceding stage, and (ii) provide an input to at least one successive stage.

A further aspect of the invention concerns a ring oscillator, comprising a plurality of inverter stages and a variable capacitor coupled to a first node between two of the inverter stages. The variable capacitor is generally configured to receive a control voltage.

Even further aspects of the invention concern a method for generating a plurality of oscillation signals, comprising the steps of applying an operating voltage to a ring oscillator having a plurality of stages and applying a control voltage to a variable capacitor coupled to a node between at least two of the stages.

The invention, in its various aspects, will be explained in greater detail below with regard to exemplary embodiments.

An Exemplary Circuit

In one aspect, the present invention relates to a circuit generally comprising first and second inverters (a "dual inverter" circuit). The first inverter is generally configured to receive a first input and to provide a first output. The second inverter is generally configured to receive the same input as the first inverter, and to provide a second output. A variable capacitor is generally coupled to the input and/or to at least one of the outputs. The circuit is suitable for use as a stage in a ring oscillator, particularly a quadrature ring oscillator. A signal delay at an input to the circuit (in the case where the variable capacitor is at the input) and/or at an output of the circuit (in the case where the variable capacitor is at the output) will depend partly on the fixed characteristics of the components and partly on the capacitance of the variable capacitor. One key to the inventive concepts disclosed herein is that when this circuit is configured in a multi-stage ring with similar circuits and or other stages, as described below, the capacitance of the variable capacitor will adjust, alter, influence and/or control the delay of each stage, and thus the frequency of the oscillator.

Figure 3:
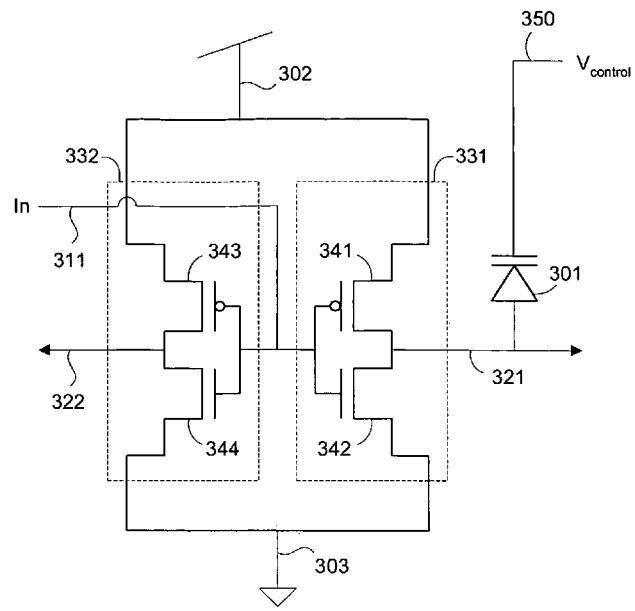
FIG. 3 is a diagram showing an exemplary dual inverter circuit according to the present invention.

FIG. 3 shows an example of the present circuit, where each of the inverters 331 and 332 comprises a p-channel transistor (341 and 343, respectively) and an n-channel transistor (342 and 344, respectively). In one embodiment the p-channel transistors 341 and 343 may be coupled directly to a supply voltage 302, and the n-channel transistors 342 and 344 may be coupled directly to ground 303. In inverter 331, the gates of both p-channel transistor 341 and n-channel transistor 342 are coupled to the input line of the circuit. One source/drain terminal of each of p-channel transistor 341 and n-channel transistor 342 are commonly coupled to the first output of the circuit 321. Transistors 343 and 344 of second inverter 332 are similarly configured, with both transistors coupled to the single input 311 of the circuit, and to the second output 322.

Figure 2:
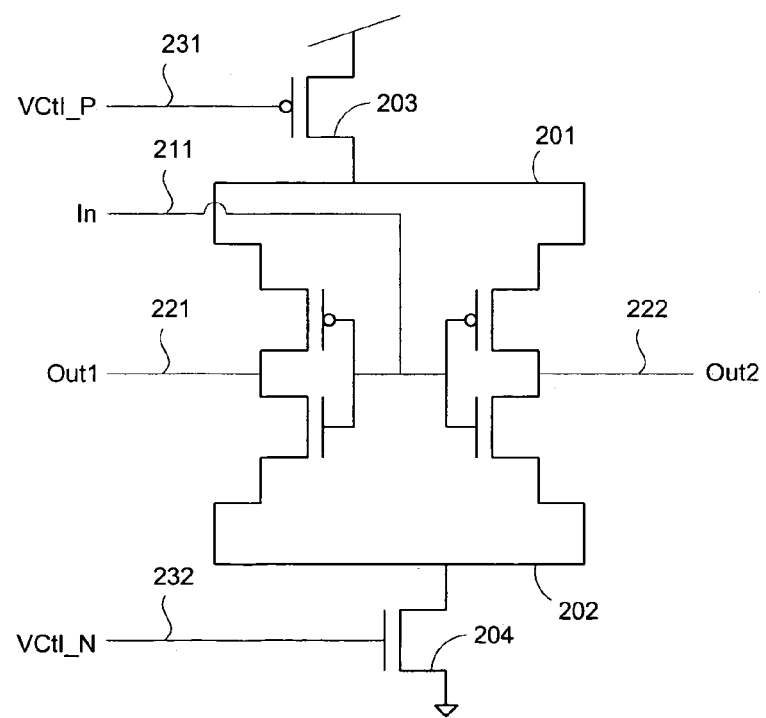
FIG. 2 is a diagram showing a conventional dual inverter circuit for use in the oscillator of FIG. 1.

In another aspect of this invention, the variable capacitor may be configured to receive a control voltage, $V_{control}$ 350, and to have a capacitance that is determined at least in part by that control voltage. In this way, the circuit delay and thus the frequency of the oscillator may depend on, relate to, or be controlled according to a predetermined relationship by a single control voltage, $V_{control}$ 350. This implementation is simpler than the implementation of the circuit of FIG. 2, where the frequency control voltage applied to the p-channel bias transistor 203 is generally different from (but which may be related to) the frequency control voltage applied to the n-channel bias transistor 204 (although the present circuit may also include such bias transistors, if so desired).

Figure 5:
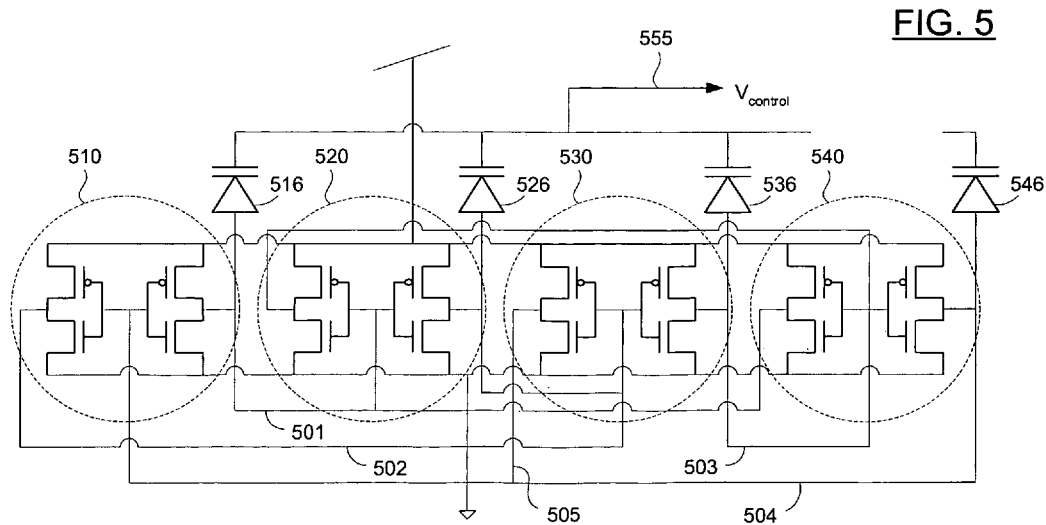
FIG. 5 is diagram showing an exemplary array oscillator employing the circuit of FIG. 3 according to the present invention.

The variable capacitor may be coupled to the input 311 and/or either or both of outputs 321 and 322 as a result of the use of the variable capacitor between stages of a ring oscillator. For example, in a fully connected ring oscillator as illustrated in FIG. 5, variable capacitor 516 is coupled to the input of second stage 520, first output 511 of first stage 510, second output 542 of fourth stage 540, at node 515.

The variable capacitor may comprise a varactor diode, with advantages as described herein. FIG. 3 shows the use of varactor diode 301 as a variable capacitor, with its anode coupled to first output 321, and its cathode coupled to control voltage 350 ($V_{control}$). Alternatively, the variable capacitor may comprise a programmable capacitor array, with k rows and m columns of individual capacitors, each coupled to a transistor or switch, each of which is configured to receive an independent configuration signal (k and m each being an integer of at least one, at least one of k and m being at least two). Each capacitor in the array may have a predetermined capacitance, so that the configuration signals may be used to configure the capacitance corresponding to a particular oscillation frequency. In one embodiment, each capacitor has (substantially) the same capacitance. In an alternative embodiment, the capacitors have successively higher or lower capacitance (e.g., each capacitor has a capacitance value of $c \cdot 2^k$, where c is a base capacitance and k is the position of the capacitor in a k×1 array).

The present circuit enjoys particular advantage in ring oscillators. Thus, the invention further concerns an oscillator, comprising a plurality of stages where at least one of the stages includes the exemplary dual inverter circuit described herein. In a further embodiment, the oscillator comprises at least four of the dual inverter stages (e.g. 4n stages, where n is an integer of one (1) or more). These dual inverter stages may be configured to receive an output of at least one preceding stage, and to provide an input to at least one successive stage (more particularly, to at least two successive stages).

In a preferred implementation, the oscillator may comprise four dual inverter stages, where each of the four stages comprises the present dual inverter circuit. Each stage is generally configured to receive a first input (e.g. both inverters receive the same input) and to provide at least one output to at least one successive stage. The second inverter of each stage is generally configured to provide a second output to a second, different successive stage. The variable capacitor is generally coupled to the input and/or to at least one of the outputs of each stage. Each stage may be configured to receive an output of at least one preceding stage (more particularly, an output of at least two preceding stages), and to provide an input to at least one successive stage (more particularly, at least two successive stages).

In a further embodiment, the variable capacitor(s) is/are configured to receive a control voltage. The capacitance(s) of the variable capacitor(s) may be determined at least in part by the control voltage, according to a predetermined relationship. The oscillator also generally provides one or more oscillator outputs, having a frequency determined at least in part by the control voltage.

An Exemplary Ring Oscillator

In another aspect, the present invention concerns a ring oscillator, comprising a plurality of inverter stages and a variable capacitor coupled to a first node between first and second inverter stages. The variable capacitor is generally configured to receive a control voltage. Each inverter stage may comprise a first inverter and a second inverter, and may be configured to (i) receive at least one output from a preceding stage, and (ii) provide at least one input to a successive stage.

In one embodiment, each of the inverter stages are generally configured to (i) provide first and second outputs to successive stages, and (ii) receive first output and second outputs from preceding stages. In some designs, one of the successive stages can also be a preceding stage. For example, FIG. 4A shows that third inverter 430 provides outputs 431 and 432 to stages 440 and 410, respectively, and receives the first output 421 of preceding stage 420 and second output 412 from preceding stage 410.

Figure 4A:
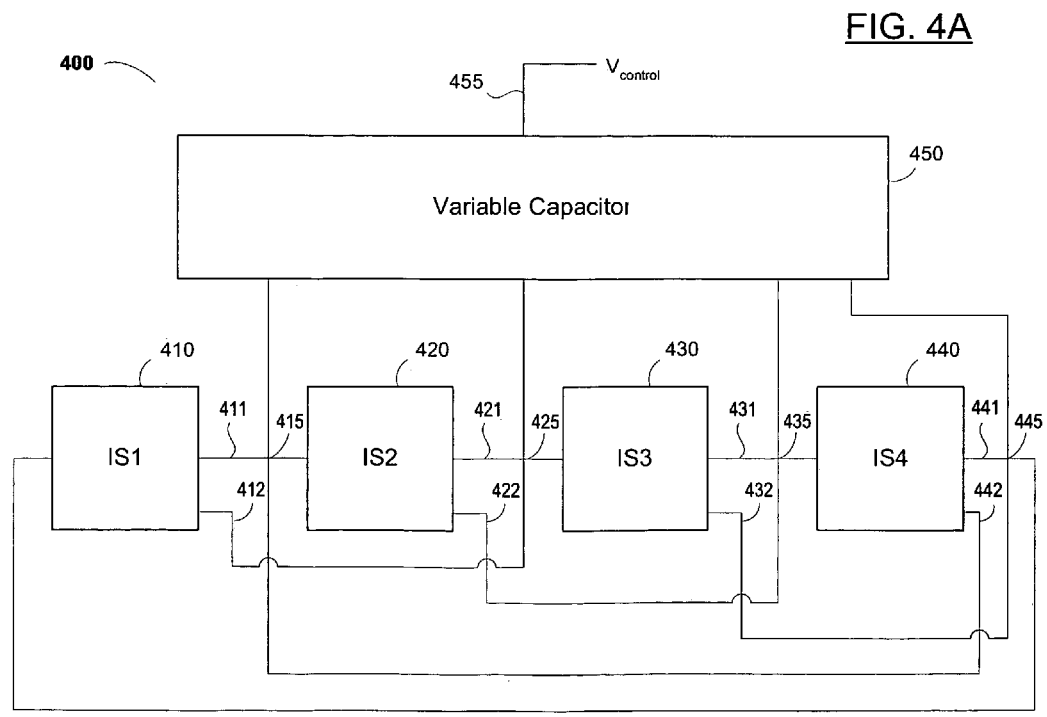
FIG. 4A is a block diagram showing an exemplary ring oscillator according to the present invention.

Referring to FIG. 4A, an exemplary interconnection of inverter stages is shown. Each inverter stage 410, 420, 430, and 440 provides an input to two successive stages, and receives the output of two preceding stages. The input of each stage may comprise a first output of one preceding stage, and a second output of another preceding stage. In the exemplary architecture of FIG. 4A, the input of each stage is further connected to variable capacitor 450. For example, the first inverter stage 410 receives the first output 441 of inverter stage 440 and the second output 432 of inverter stage 430. Inverter stage 410 also provides output 411 to inverter stage 420 and output 412 to inverter stage 430. Inter-stage node 445, connected to the input of inverter stage 410 and to outputs 441 and 432 is further connected to variable capacitor block 450.

In this embodiment, outputs 411 and 421 are in quadrature, as are the outputs of all adjacent stages. Outputs 411 and 431 are inverses of each other; i.e., they represent true and complement signals. The frequency of the oscillator may be tuned by adjusting the control voltage 455 ($V_{control}$). The tuning range of circuit 400 depends partly on the physical components of each transistor stage, and partly on the capacitance variation of the variable capacitor as a function of $V_{control}$. The control voltage $V_{control}$ may be determined during circuit design, or may be dynamically generated to produce a desired output frequency. Circuitry for determining a predetermined or desired frequency, and for generating an appropriate $V_{control}$ to produce such a frequency, is conventional, the design and implementation of such circuitry is within the abilities of those skilled in the art. Complex regulators are not necessary (although one may choose to use a voltage regulator to provide $V_{control}$ if desired). In the embodiment where the variable capacitor comprises a programmable capacitor array, $V_{control}$ will generally be about 0 volts (ground).

The ring oscillator may comprise an even number of stages. The ring oscillator may advantageously be configured such that an oscillation signal on the first output of each stage is in quadrature with an oscillation signal on the first output of a previous stage. For example, the ring oscillator 400 depicted in FIG. 4A has four stages. When each of the stages is identical, the delay of each stage will be equivalent to 1/n of the period of oscillation, where n is the number of stages in the oscillator. The four stages of ring oscillator 400 result in a delay of approximately ¼ of the period of oscillation, so the outputs are in quadrature. This means that the output of each stage is in quadrature, or 90° out of phase with the preceding stage. For example, the oscillation of the third stage 430 is 180° out of phase with (or complementary to) the first stage 410, and the output of fourth stage 440 is 270° out of phase with the first stage 410. It will be recognized that an oscillator with 8 (or any multiple of four) stages may also produce quadrature outputs.

Figure 4B:
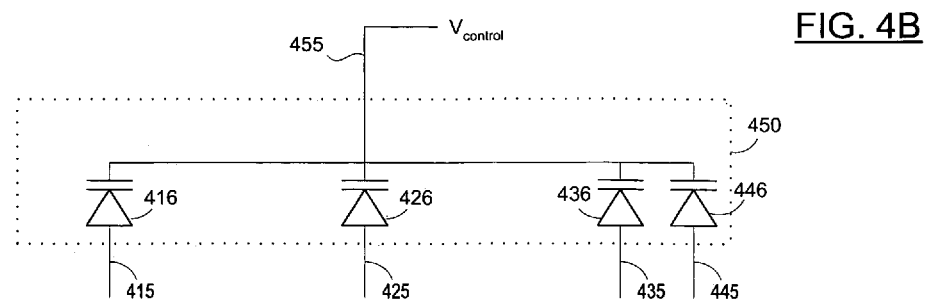
FIG. 4B is a detail view of variable capacitor block 450, with one variable capacitor for each inverter stage.
Figure 4C:
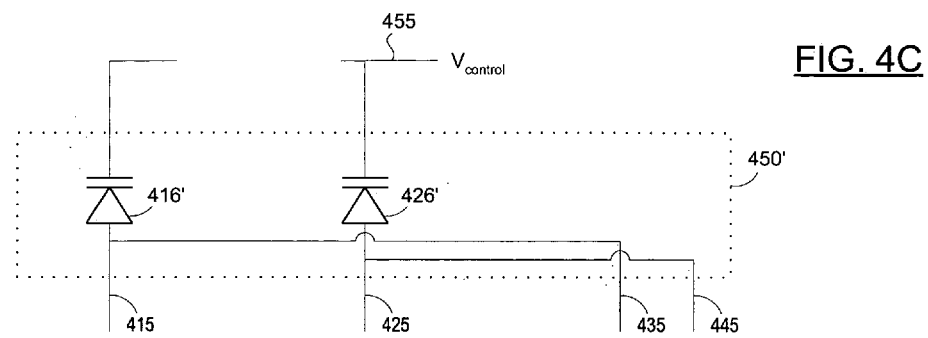
FIG. 4C is a detail view of variable capacitor block 450, with one variable capacitor for every two inverter stages.

The variable capacitor block 450 generally comprises a plurality of variable capacitors. The terminal of a variable capacitor (other than the one receiving $V_{control}$) may be coupled to multiple nodes. For example, two variable capacitors may each couple to two nodes. Preferably, each inter-stage node (nodes 415, 425, 435, and 445) is coupled to a unique variable capacitor (each of which receives $V_{control}$). For example, FIG. 4B shows a variable capacitor block 450 wherein each inter-stage node 415, 425, 435, and 445 is coupled to distinct variable capacitor 416, 426, 436, and 446, respectively. Each of the variable capacitors is further coupled to $V_{control}$ 455. Alternatively, FIG. 4C shows an exemplary variable capacitor block 450' wherein inter-stage nodes 415 and 435 are both coupled to variable capacitor 416', and inter-stage nodes 425 and 445 are both coupled to variable capacitor 426'. Variable capacitors 416 and 426 are each further coupled to $V_{control}$ 455.

In another embodiment, the signal delay between an output of a first one of said inverter stages and an input of a second one of said inverter stages is determined at least in part by the control voltage. Additionally, an output oscillation frequency of at least one of the inverter stages may be determined at least in part by the control voltage.

Figure 6:
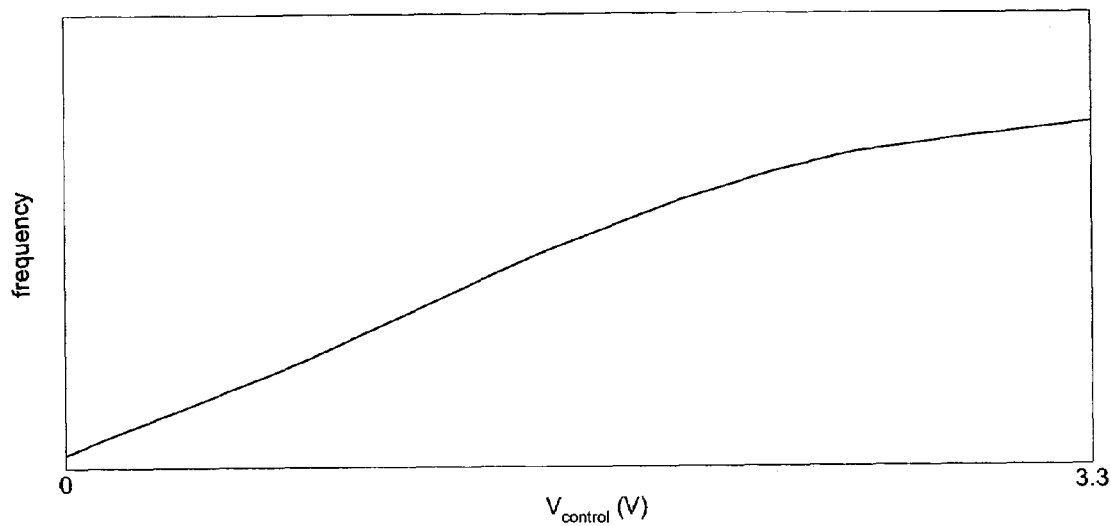
FIG. 6 shows an exemplary pulling curve for the present invention, showing the output frequency of an oscillator as a function of control voltage $V_{control}$.

The variable capacitor may advantageously comprise a varactor diode. Varactor diodes typically display a linear relationship between the reverse-biased voltage and diode capacitance over some known range of reverse-biased voltage. In the present invention, this linear relationship facilitates the tuning of the circuit. Referring now to FIG. 5, the control voltage 555 ($V_{control}$) may be applied to variable capacitors 516, 526, 536, and 546, where the variable capacitors comprise varactor diodes. The tuning range of the circuit depends partly on the physical components of each inverter (e.g. the inverters of stage 510), and partly on the capacitance variation of the variable capacitors as a function of $V_{control}$. Given a substantially linear relationship between $V_{control}$ and the capacitance of each varactor diode 516, 526, 536, and 546, the resulting output frequency will generally also have a substantially linear relationship to $V_{control}$ over a known range of voltages. FIG. 6 shows an exemplary pulling curve for the present invention, plotting the output frequency of an oscillator of the architecture of FIG. 5, as a function of control voltage $V_{control}$, over the range of linearity of a typical varactor diode.

An exemplary fully interconnected oscillator is shown in FIG. 5. The oscillator comprises four stages, where each stage comprises circuit 300 of FIG. 3. The first output of each circuit is coupled to both the variable capacitor and to an input of at least one succeeding stage. In addition, the second output is coupled to an input of a second, different succeeding stage. Accordingly, in this embodiment, each stage receives the output of two preceding stages.

For example, in FIG. 5, first dual inverter stage 510 provides inputs 501 and 502 to succeeding second inverter stage 520 and third inverter stage 530, respectively, while receiving inputs 504 and 505 from preceding fourth inverter stage 540 and third inverter stage 530, respectively. The feed-forward inverters of these stages allow the ring to oscillate at a characteristic, or predetermined, frequency. Variable capacitors 516, 526, 536, and 546 adjust, alter, influence and/or control the delay of the inverter stages, as described herein, and thereby adjust, alter, influence and/or control the frequency of the oscillator according to a predetermined relationship (e.g. between $V_{control}$ and the frequency of oscillation).

The variable capacitors 516, 526, 536, and 546 are generally configured to receive a control voltage 555 ($V_{control}$), and to have a capacitance that is determined at least in part by $V_{control}$. In this embodiment, $V_{control}$ can also adjust, alter, influence or to control the delay of each stage, and thus the frequency of the oscillator. The output of each stage generally oscillates at the same frequency, but the phase of each output will be offset determined by a characteristic amount, generally determined by the number of stages (e.g. 360°/n, where n=the number of stages). This delay between the input to the stage and the capacitor-coupled output of the stage will depend partly on the fixed characteristics of the components and partly on the capacitance of the variable capacitor. Varying the capacitance of the variable capacitor will generally not affect the signal swing of the outputs. No bias transistors, complex (or off-chip) regulator circuits, or special output circuits are needed.

Thus, each inverter stage may comprise first and second CMOS inverters. An integrated circuit may then be formed, comprising the entire ring oscillator, one or more control voltage generators (which may comprise a voltage regulator, a voltage divider, etc.), one or more frequency multipliers and/or dividers, one or more filters, a plurality of clock buffers (each of which may be three-statable), etc. Conventional ring oscillators generally have very low silicon area when integrated on a chip. The present invention, using a varactor diode, may also be advantageously implemented on a very low silicon area. All of the varactor diodes used in such a circuit may advantageously be fabricated in a single well with shared diffusions. It is well within the abilities of one skilled in the art to design and use such an integrated circuit.

Exemplary Methods

The present invention further relates to methods of controlling an oscillation frequency and/or generating a plurality of oscillation signals. The control method comprises the steps of applying an operating voltage to a ring oscillator comprising a plurality of stages, and applying a control voltage to a variable capacitor coupled to a node between at least two of the stages. In a preferred embodiment, the variable capacitor comprises a varactor diode. The method of generating an oscillation frequency may further comprise the step of producing an output signal from the ring oscillator. In various embodiments, the method may further comprise multiplying and/or dividing the output signal by factors of p and q, respectively, where p and q are independently an integer of one (1) or more (and where one of p and q is one (1), the other is at least two (2)). In one specific implementation, the method produces a plurality of output signals in quadrature.

In a further embodiment, the method(s) further comprise the step of adjusting the control voltage such that at least one of the oscillation signals has a frequency substantially equal to the frequency of an incoming signal (or that is a p/q multiple of such a signal, where p and q are independently an integer of one (1) or more, and at least one of p and q is at least two (2)). For example, the incoming signal may comprise a reference signal. In another example, processing of data for digital logic or communications applications advantageously uses a clock source having a frequency substantially the same as (or a p/q multiple of) that of the incoming data. When the frequency of the incoming data is determined (e.g., using conventional clock recovery circuitry), the control voltage may be set or adjusted such that a frequency substantially equal to the frequency of the incoming data (or a p/q multiple thereof) may be generated.

CONCLUSION/SUMMARY

Thus, the present invention provides circuits and methods for generating oscillator outputs. The circuits may be easily implemented using widely available CMOS technology, and the oscillator outputs may be tuned using a single control voltage.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A ring oscillator, comprising a plurality of inverter stages and a variable capacitor coupled to a first node between first and second inverter stages, said variable capacitor configured to receive a control voltage; wherein:

each of said inverter stages comprises a first inverter and a second inverter;

each of said inverter stages is configured to (i) receive at least one output from a preceding stage, and (ii) provide at least one input to a successive stage;

each of said inverter stages are configured to (i) provide a first output and a second output, and (ii) receive said first output from a preceding stage, and said second output from another preceding stage.

2. The ring oscillator of claim 1, comprising an even number of stages.

3. The ring oscillator of claim 2, wherein an oscillation signal on said first output of each stage is in quadrature with an oscillation signal on said first output of a previous stage.

4. The ring oscillator of claim 1, wherein a signal delay between an output of at least one of said inverter stages and an input of at least one of said inverter stages is determined at least in part by said control voltage.

5. The ring oscillator of claim 1, wherein an output oscillation signal of at least one of said inverter stages is determined at least in part by said control voltage.

6. The ring oscillator of claim 1, wherein said variable capacitor comprises a varactor diode.

7. The ring oscillator of claim 1, wherein each inverter stage comprises first and second CMOS inverters.

8. An integrated circuit, comprising the ring oscillator of claim 7.

* * * * *